United States Patent
O'Connor et al.

(10) Patent No.: US 6,843,608 B2
(45) Date of Patent: Jan. 18, 2005

(54) TRANSPARENT SUBSTRATE AND HINGED OPTICAL ASSEMBLY

(75) Inventors: Gary O'Connor, Bolingbrook, IL (US); Randy Wickman, Cadott, WI (US); John Greene, Chippewa Falls, WI (US); Daniel Mansur, Chippewa Falls, WI (US); Dave Barneson, Eleva, WI (US); Bryan Gregory, Glen Ellyn, IL (US)

(73) Assignee: Corona Optical Systems, Inc., Lombard, IL (US)

( * ) Notice: Subject to any disclaimer, the term of this patent is extended or adjusted under 35 U.S.C. 154(b) by 0 days.

(21) Appl. No.: 10/832,726

(22) Filed: Apr. 27, 2004

(65) Prior Publication Data

US 2004/0208461 A1 Oct. 21, 2004

Related U.S. Application Data

(62) Division of application No. 10/219,749, filed on Aug. 15, 2002, now Pat. No. 6,729,776, which is a division of application No. 09/951,646, filed on Sep. 13, 2001, now Pat. No. 6,450,704.
(60) Provisional application No. 60/239,058, filed on Oct. 5, 2000.

(51) Int. Cl.$^7$ .................................................. G02B 6/36
(52) U.S. Cl. .................................................. 385/92; 385/91
(58) Field of Search ........................ 385/88–94, 114–115

(56) References Cited

U.S. PATENT DOCUMENTS

| | | | |
|---|---|---|---|
| 5,539,848 A | * | 7/1996 | Galloway ..................... 385/89 |
| 5,625,734 A | | 4/1997 | Thomas et al. |
| 5,768,456 A | | 6/1998 | Knapp et al. |
| 5,835,646 A | | 11/1998 | Yoshimura et al. |
| 6,034,808 A | * | 3/2000 | Isaksson ..................... 359/245 |
| 6,234,687 B1 | | 5/2001 | Hall et al. |
| 6,318,909 B1 | | 11/2001 | Giboney et al. |
| 2003/0031431 A1 | * | 2/2003 | Kunkel et al. ................ 385/92 |
| 2004/0028349 A1 | * | 2/2004 | Nagasaka et al. ............. 385/88 |
| 2004/0067029 A1 | * | 4/2004 | Wickman ..................... 385/88 |

* cited by examiner

*Primary Examiner*—Ellen E. Kim
(74) *Attorney, Agent, or Firm*—Welsh & Katz, Ltd.

(57) ABSTRACT

A method and apparatus are provided for providing an electro-optic signal processing device. The method includes the steps of providing an optically trasparent substrate having first and second planar elements with an abutting common edge, the planar elements lying at differing angles with respect to each other about the common edge and a plurality of alignment apertures formed in the substrate. A plurality of optical devices of an optical array are disposed on the first planar element of the substrate, with transmission paths of the optical devices passing directly through the substrate. A signal processor is also disposed on the first planar element of the substrate. An optical fiber holder comprising a plurality of respective optical fibers and guide pin apertures disposed on a first surface of the optical fiber holder is aligned to the optical array using the guide pins and guide pin apertures. Optical signals of the optical devices of the optical array are coupled to respective optical fibers of the aligned optical fiber holder. A printed circuit board having a first surface is attached to a mating surface of the substrate's second planar element.

31 Claims, 8 Drawing Sheets

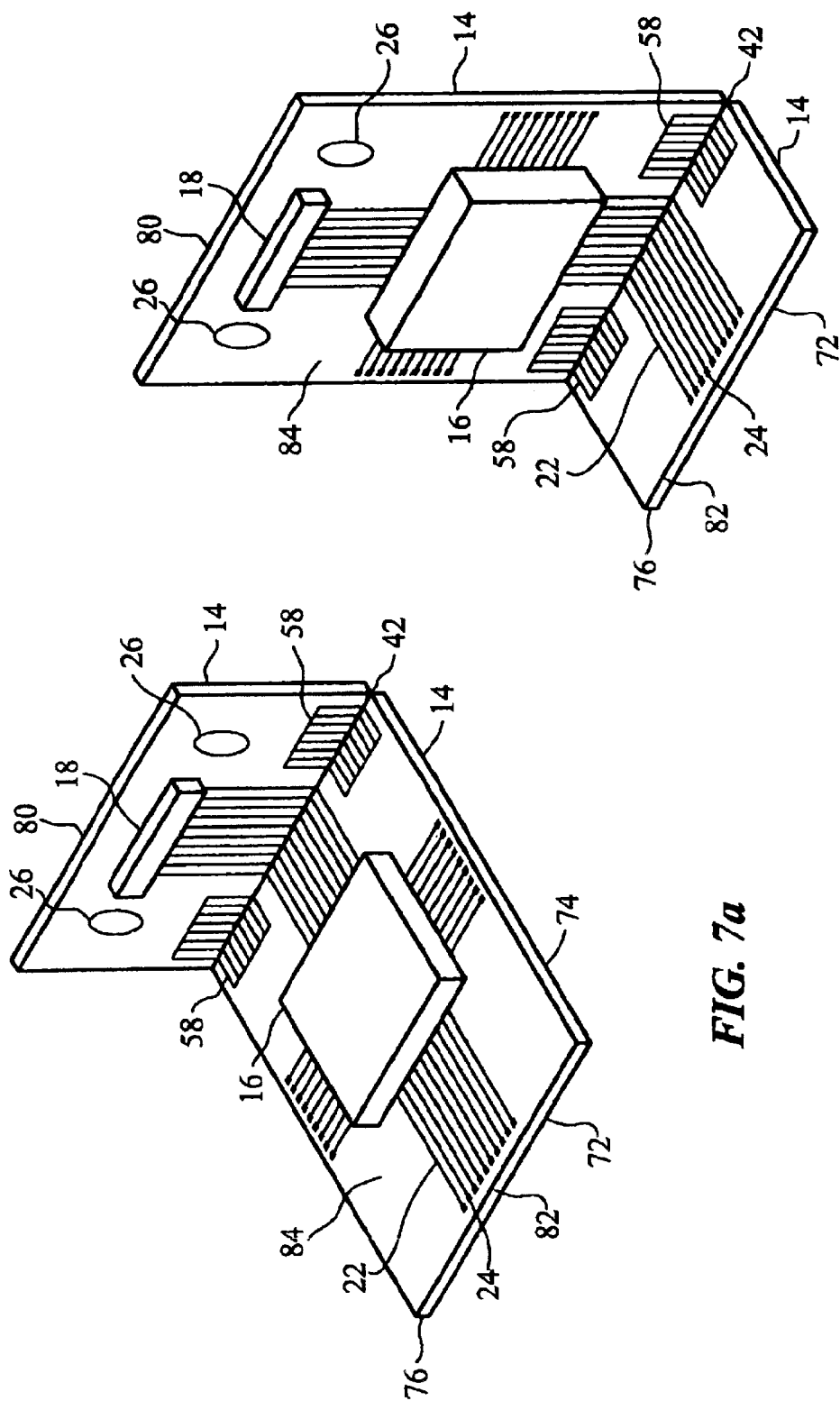

TRANSPARENT SUBSTRATE AND HINGED OPTICAL ASSEMBLY

CROSS REFERENCE TO RELATED APPLICATIONS

This application is a divisional patent application of U.S. patent application Ser. No. 10/219,749 filed on Aug. 15, 2002 now U.S. Pat. No. 6,729,776, which is a divisional of U.S. patent application Ser. No. 09/951,646, filed on Sep. 13, 2001 (now U.S. Pat. No. 6,450,704), which is a continuation-in-part of U.S. Prov. Pat. Appl. No. 60/239,058 filed on Oct. 5, 2000 (now abandoned).

FIELD OF THE INVENTION

This invention relates, in general, to fabrication of optical devices and, more particularly, to interconnecting optical devices and optical fibers.

BACKGROUND OF THE INVENTION

The coupling of an optical device or array of optical devices, an optical fiber or array of optical fibers, and an interconnecting substrate can be a difficult task. Usually the coupling is done manually or semi manually and can incur several problems such as being complex, inefficient, and not suitable for high volume manufacturing.

In order to reduce electrical parasitics, short electronic interconnects are needed between semiconductor photonic devices such as lasers and photodiodes and electronic interface circuitry. This electronic circuitry may include photonic signal drivers and photonic signal receivers. The need for decreased distance between photonic devices and electrical interface circuitry increases as the signaling data rate increases. Photonic components are often placed on simple carrier substrates to verify operation, to do burn-in, or simply to facilitate handling of that device. This photonic device and carrier substrate are then placed on another substrate and additional packaging is completed. This packaging adds additional electrical interfaces, such as wire bonds and long non-controlled impedance wires, decreasing the electrical performance of the photonic device.

In order to reduce optical losses and parasitics, efficient coupling of optical signals is needed. As optical signals tend to diverge from their original transmission axis, coupling devices or waveguides must be proximate optical transmitting and receiving devices. Signal loss increases with increased distances from an optical port to an optical connector, unless light is adequately directed through a coupling device. One example of a setup with limitations because of increased distance between the optical device and optical fiber is an electro-optic TO can with an optical port. After placing the optical component in a can and making electrical wire bonds, further packaging must be done in the alignment with a fiber optic cable. The distance between the optical device and the fiber is often relatively large, minimizing or eliminating the possibility of multiple optical devices on the same semiconductor substrate. With increased distances between a waveguide and multiple optical devices disposed on the same semiconductor, optical cross talk can reduce signal integrity.

Some prior art devices have reduced the length of electrical and/or optical interconnects by placing multiple components on a common, flexible substrate. Other prior art references teach of the use of lensing systems to guide light appropriately, thus allowing multiple optical devices on the same semiconductor while minimizing optical losses. Yet, lensing may require multiple optical couplings which can lead to signal loss. In addition, multiple waveguides require additional steps in aligning optical signals with an external optical waveguides and connectors, thus increasing manufacturing costs and decreasing yield.

Commonly used vertical cavity surface emitting laser (VCSEL) structures and photodiode structures have both electrical contacts and optical ports on the same surface of the semiconductor, creating packaging problems when trying to optimize the performance of each of these interfaces. These packaging problems are exacerbated when the optical components have arrays of optical devices. A novel packaging technique is described below under illustrated embodiments of the invention that combines complex electrical and optical trace patterns, and simplifies packaging by using a common transparent substrate. This transparent photonic circuit board could support arrays of photonic chips and electrical interface circuitry while reducing electrical losses, optical losses, and manufacturing costs.

SUMMARY OF THE INVENTION

A method and apparatus are provided for providing an electro-optic signal processing device. The method includes the steps of providing an optically transparent substrate having first and second planar elements with an abutting common edge, the planar elements lying at differing angles with respect to each other about the common edge and a plurality of alignment apertures formed in the substrate. A plurality of optical devices of an optical array are disposed on the first planar element of the substrate, with transmission paths of the optical devices passing directly through the substrate. A signal processor is also disposed on the first planar element of the substrate. An optical fiber holder comprising a plurality of respective optical fibers and guide pin apertures disposed on a first surface of the optical fiber holder is aligned to the optical array using the guide pins and guide pin apertures. Optical signals of the optical devices of the optical array are coupled to respective optical fibers of the aligned optical fiber holder. A printed circuit board having a first surface is attached to a mating surface of the substrate's second planar element.

BRIEF DESCRIPTION OF THE DRAWINGS

FIG. 7a illustrates a perspective view of a bent substrate with corresponding components, features, and traces on the substrate.

FIG. 7b illustrates a perspective view of a bent substrate with the hinge in a different location.

DETAILED DESCRIPTION OF A PREFERRED EMBODIMENT OF THE INVENTION

Figure 1:
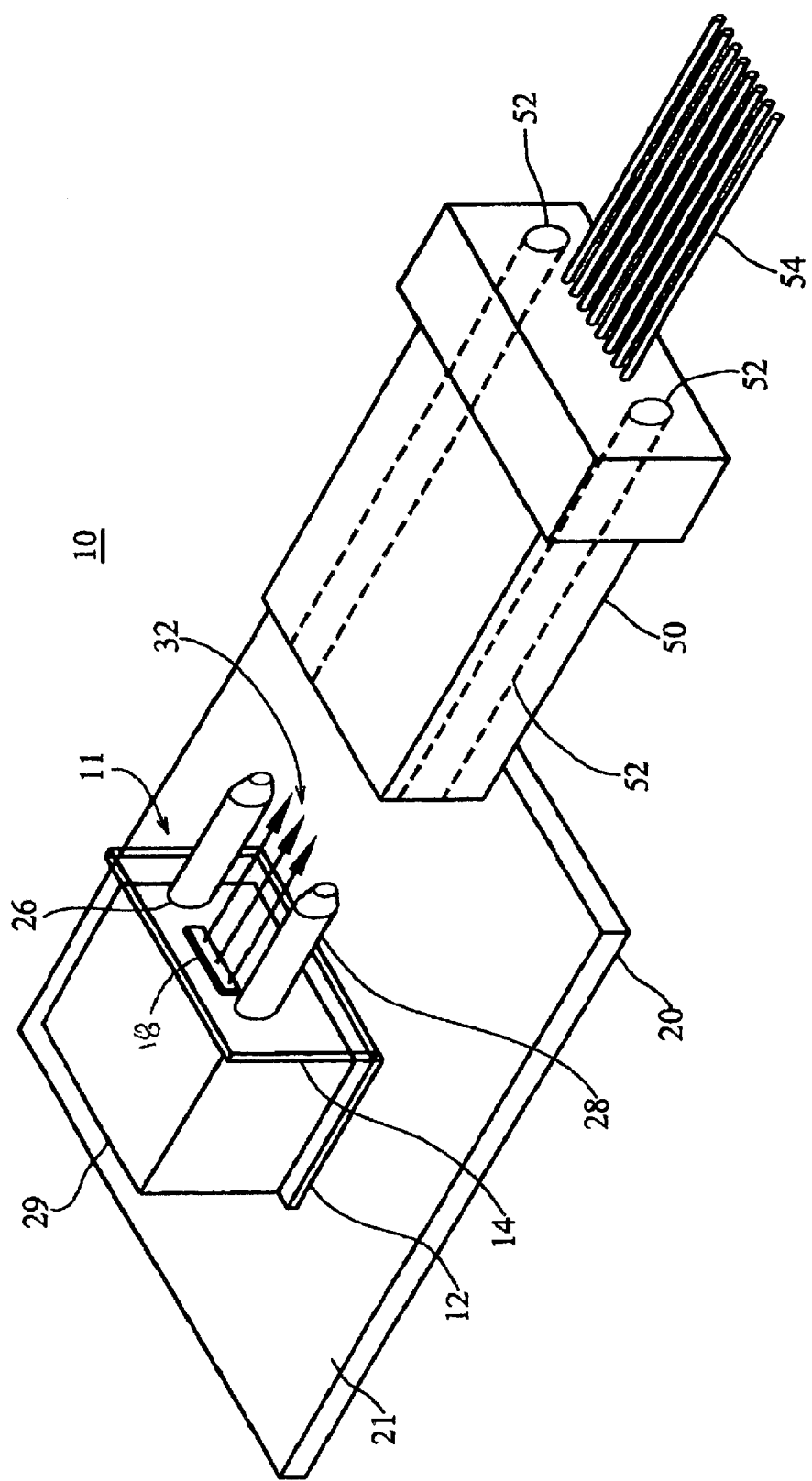
FIG. 1 illustrates a perspective view of an electro-optic communications device in accordance with an illustrated embodiment of the invention, in a context of use.

FIG. 1 illustrates an electro-optic communications assembly 10 in a context of use, according to a preferred embodiment of the invention. Included in the communications assembly 10 may be a printed circuit board 20, optically transparent, relatively rigid substrate 11 with a right angle bend, and an alignment mechanism 50 for holding optical fibers 54 in alignment with an active optical device 18. The printed circuit board 20 may be any suitable material such as FR4, ceramic interconnect, or the like. The printed circuit board 20 may have a plurality of electrical and optical devices for signal processing, as well as electrical traces and electrical pads (not shown in the figures). The optically transparent substrate 11 may comprise glass or a glass-like structure having desirable optical and structural properties. The optically transparent substrate 11 may be divided into an upright portion and a horizontal portion. A second surface 86 of the horizontal portion of the substrate 11 may be attached to a first surface of the printed circuit board 20 as shown in FIG. 1. A method for attaching may include use of a conductive adhesive or similar material.

Figure 2:
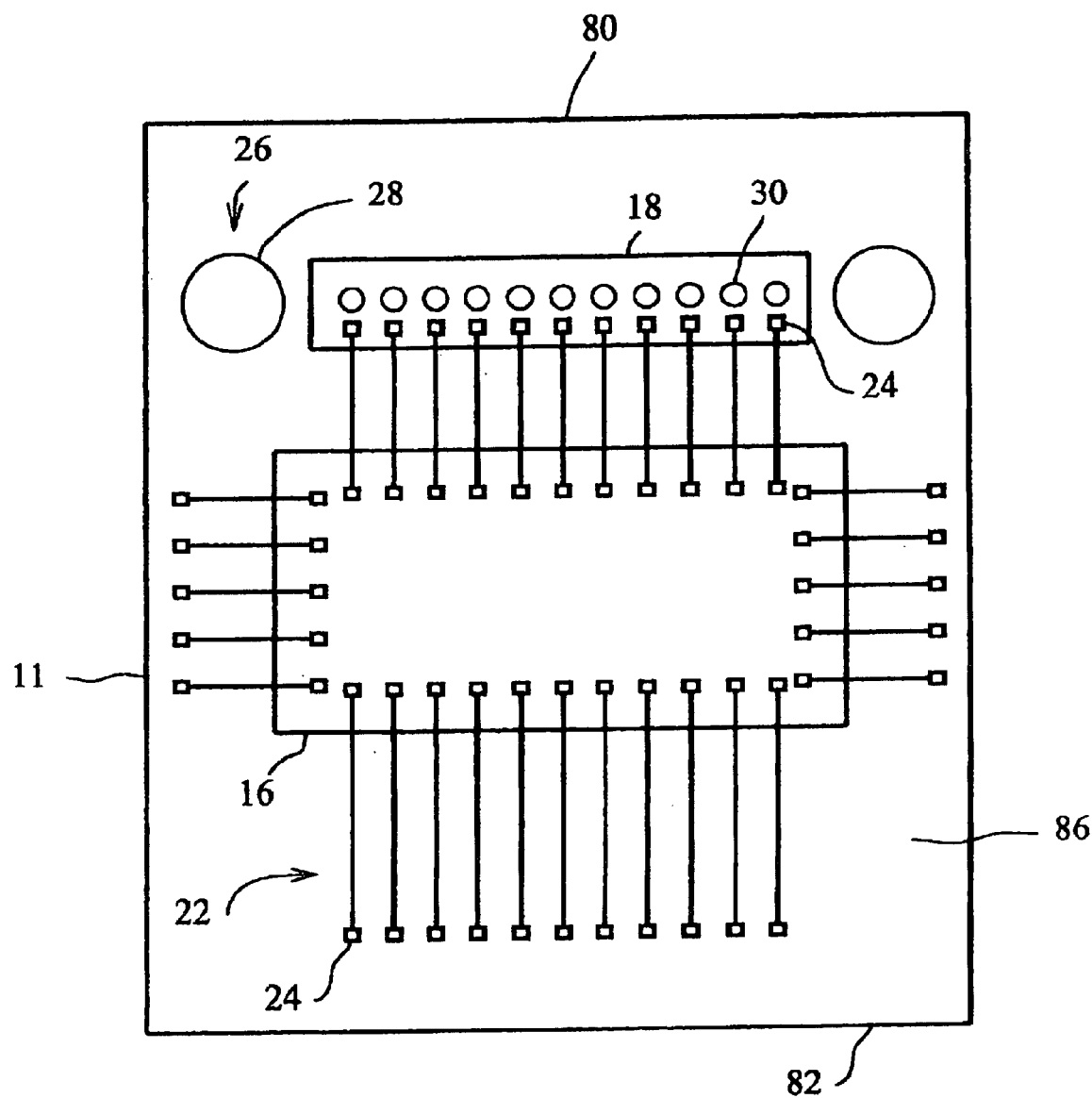
FIG. 2 illustrates a bottom view of an optically transparent substrate with corresponding features and components on the substrate.
Figure 3:
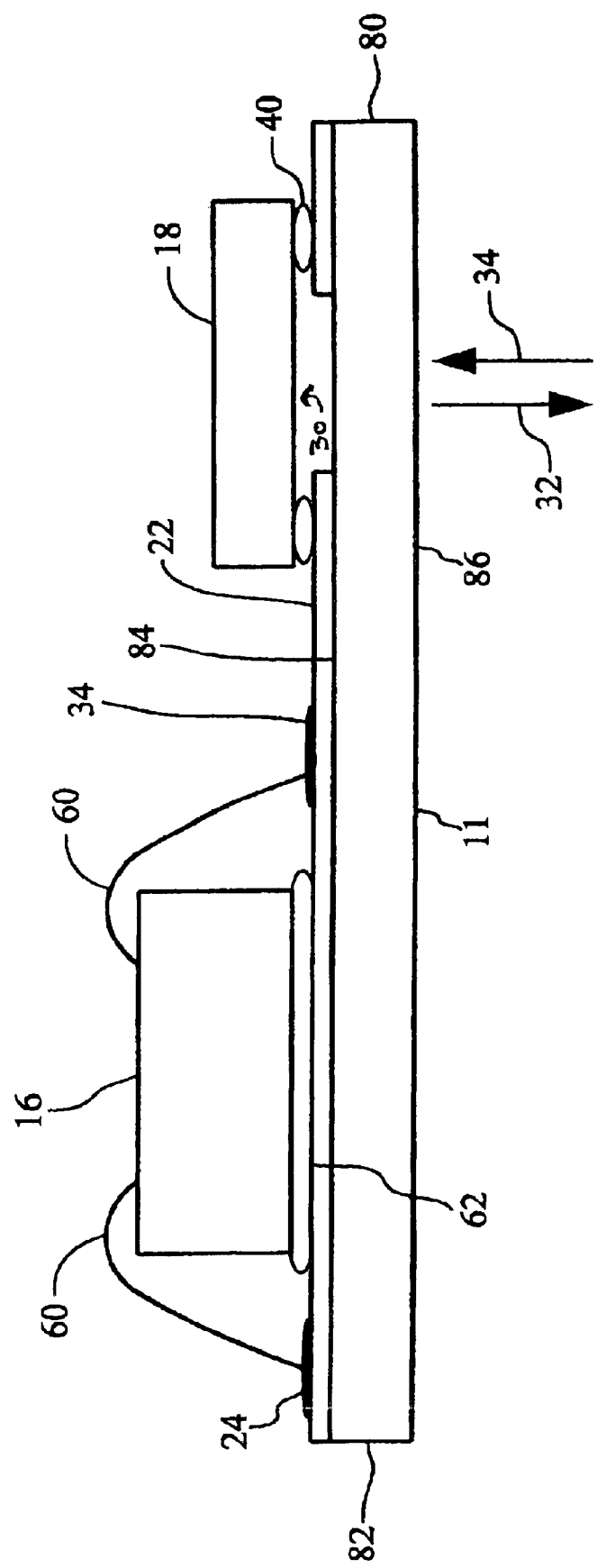
FIG. 3 illustrates a side view of an optically transparent substrate with corresponding features and components on the substrate.

FIG. 2 illustrates a bottom view of a planarized optically transparent substrate 11. The substrate 11 may include the active optical device 18, a signal processor 16, electrical traces 22, and electrical pads 24. It will be understood that the active optical device 18 can be any suitable photonic device or array of photonic devices including photo-transmitters, photo-receivers, or a combination thereof. A photo-transmitter can be any suitable device such as a vertical cavity surface emitting laser (VCSEL), light emitting diode (LED), or the like. Furthermore, any suitable photo-receiving device can be used, such as a photodiode, i.e., P-I-N diode, PN diode, or the like. Thus, the active optical device 18 can be a broad range of photoactive devices with transmitting and receiving capabilities. Each optical array may have a number of optical ports 30 for coupling optical signals to a respective photoactive device. The optical ports 30 define the optically active surfaces of the optical device 18. The optical ports 30 provide an optical transmission path to photonics transmitters, receivers, or a combination of transmitters and receivers. The transmission paths 32 and 34 of the optical device 18 may pass directly through the substrate 11 to which the device 18 is attached, as shown in FIG. 3. In the view shown in FIG. 2, the transmission paths could be normal to the substrate 11 (i.e., transmitting out of the page).

The substrate 11 may also comprise a signal processor 16. The signal processor 16 may be an amplifier mechanically attached to the substrate 11 by a conductive adhesive, solder bumps, or similar bonding technique. The signal processor 16 may be electrically connected to the active optical device 18 by stud/solder bumps with corresponding electrical traces 22 that may traverse the length of the substrate 11. Electrical traces 22 may be defined on the substrate 11 by conventional photolithographic etching processing, or a by any similar process. The substrate 11 may also have electrical traces 22 and electrical pads 24 for electrically interconnecting components that are a combination of those attached and those not attached to the substrate 11. For example, wire bonds 60, (shown in FIG. 3), may be disposed between electrical pads 24 on the substrate 11 and nearby opto-electric components, or to the printed circuit board 20.

Alignment apertures 26 (FIG. 2) may also be provided on the substrate 11. To properly align the optical ports 30 of the optical array 18 to the optical fibers 54 of the fiber holding alignment mechanism 50, alignment apertures 26 are formed in the substrate 11. The apertures 26 passing through the substrate 11 may be disposed on opposing sides of the optical array 18, precisely positioned relative to the optical array 18 proximate a first edge 80 of the substrate 11. Alignment apertures 26 may be formed using conventional techniques such as laser ablation, chemical etching, plasma etching, or a similar process. Alignment pins 28 may be inserted concurrently through the apertures 26 formed in the substrate 11 and into apertures 52 formed on a first surface 56 of the fiber holding alignment mechanism 50, thereby aligning the optically transparent substrate 11 and optical array 18 with the fiber holding alignment mechanism 50 and its respective optical fibers 54. In a preferred embodiment of the invention, the fiber holding alignment mechanism 50 could be a standard MT connector manufactured by US Conec or Nippon Telephone & Telegraph (US Conec Part number MTF-12MM7).

The alignment pins 28 aligning the optical array 18 to the fiber holding alignment mechanism 50 may be held in place by an alignment pin holder 29. The pin holder 29 may be located proximate the first surface 84 of the substrate 11, opposite the fiber holding alignment mechanism 50. The pin holder 29 (shown in FIG. 1) maybe attached to the electrical IC 16. The electrical IC 16 is shown, in FIG. 8b, attached to the substrate 11 by a conductive adhesive 62, or similar material. The guide pins 28 may be attached to the pin holder 29 by an adhesive, or the pins 28 and holder 29 could be formed by a conventional insert molding or compression fit process.

FIG. 3 illustrates a side view in an embodiment of the invention. Here the electrical IC 16 is shown electrically connected to the substrate 11 by means of wire bonds 60. The wire bonds 60 may be attached to electrical pads 24, which may be attached to electrical traces 22, which may be attached to the substrate 11. It is understood that the electrical IC can be electrically connected to the substrate 11 by additional means such as solder or stud bumps. The optical IC 18 can also be electrically connected to the substrate 11 by means of wire bonds, stud bumps, solder bumps, or any other similar electrical attachment method.

Also shown in FIG. 3 is the optical transmission axis 32 and 34. The optical device 18 could be a transmitting device, and light would propagate from the device 18 and travel through the substrate 11 in the direction 32 shown. The optical device 18 could be a receiving device, and light coming in the direction of the arrow 34 would pass through the substrate 11 and strike the receiving device 18. In either case, optical energy 32 and 34 would pass directly through the optically transparent substrate 11. In an embodiment of the invention shown in FIG. 3 using an example of a laser for the optical array 18, light must propagate 32 through the substrate 11 and away from or at least parallel to the planar surface 21 to which the substrate 11 is attached. Otherwise, if the substrate 11 did not have the right-angle bend as shown in FIG. 1, then light would strike the surface the top surface 21 of the PCB 20, the surface to which the substrate 11 is mounted to, and not enter a waveguide 50. Yet, if the portion of the substrate 11 having optical energy paths 32 and 34 was not in direct contact with the PCB 20, a waveguide could then be placed proximate the opposing surface 86 of the substrate 11.

Figure 4:
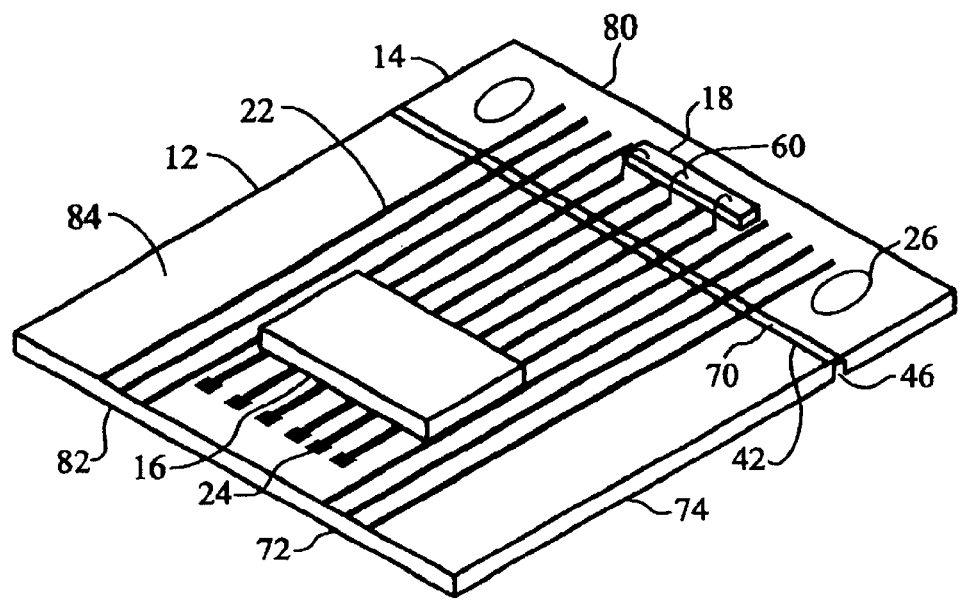
FIG. 4 illustrates a perspective view of an optically transparent substrate with electrical traces traversing over a hinge on the substrate.
Figure 5:
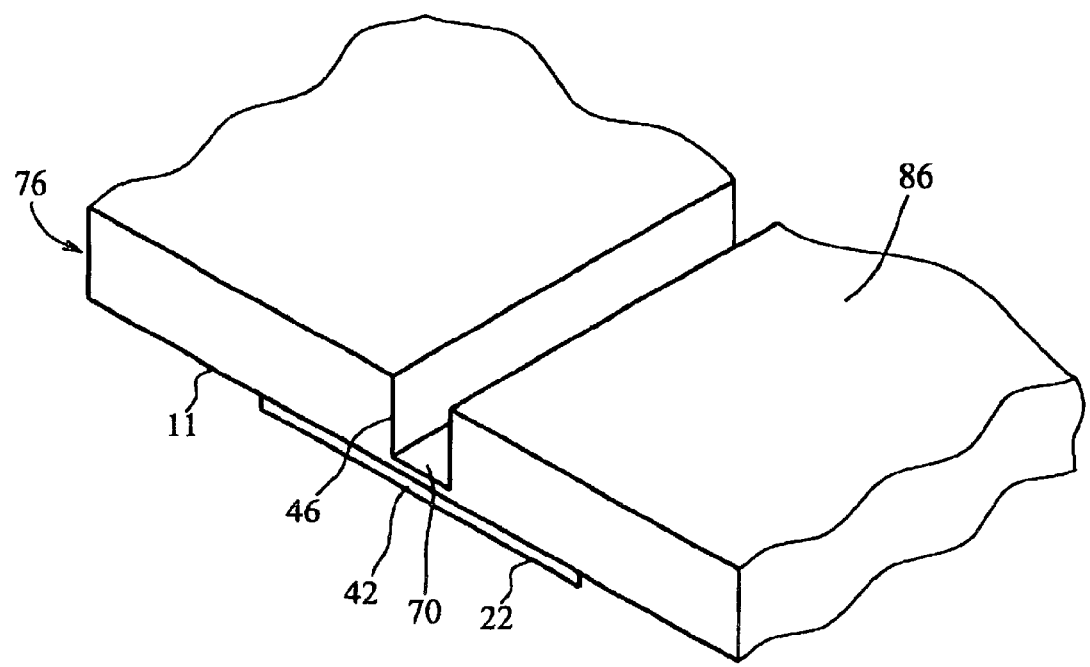
FIG. 5 illustrates an enlarged perspective view of a removed portion of the substrate.

As shown in FIGS. 1, 7a, and 7b, the substrate 11 may have a 90 degree bend to allow optical signals to travel parallel to the PCB 20. As illustrated in FIGS. 4, 5, 7a, and 7b the 90 degree bend in the substrate 11 may be formed by breaking the substrate along a groove 46 and rotating a portion of the substrate 11 about the groove 46. After breaking, the substrate 11 may then become a two-member body, having relatively rigid planar elements 12 and 14. The groove 46, shown in the greatly enlarged underside cut-a-way view of FIG. 5, may be formed on the second surface 86 of the substrate 11, along the width 72 of the substrate 11, and at any location along the length 74 of the substrate 11. The groove 46 could be formed using a conventional laser ablation, laser scribing, or mechanical scribing process. The groove 46 may traverse the width 72 while not extending through the thickness 76 of the substrate 11, as illustrated in FIG. 5 (i.e., about 90% through the thickness). If the groove 46 is formed completely through the thickness 76 of the substrate, the electrical traces 22 could be damaged or separated. The broken substrate 11 with first and second planar elements 12 and 14 may have an abutting common edge 70, as shown in FIG. 4. Upon forming the groove 46 partially through the substrate 11, the grooved substrate 11 could be placed in a mechanical fixture that could break the substrate 11 by rotating a planar element 12 or 14 about the groove 46 with respect to the other planar element.

The first and second planar elements 12, 14 may be rotated to any position with respect to the common edge 70. Once rotated, the first and second planar elements 12, 14 may lie at differing angles with respect to each other about the common edge 70 (e.g., the planar elements may form an angle of 90 degrees on one side and 270 degrees on the other side).

Conductive traces 22 may traverse the substrate 11 (i.e., connect the two halves 12, 14 of the substrate 11) and may structurally and electrically interconnect the two planar elements. The conductive traces 22 traversing the two planar elements may form a hinge 42 extending the width 72 of the substrate 11 (the hinge 42 being located along the common edge 70). The second planar element 14 may be rotated along the hinge 42 to any desired angle 88. In a preferred embodiment of the present invention, the second planar element 14 may be rotated ninety degrees, forming a ninety-degree angle with the substrate's first planar element 12. Rotating of the substrate to a desired angle 88 could complete the process of breaking the substrate 11 into two sections 12 and 14. That is, the planar substrate 11 could be broken and rotated to a desired angle 88 by necessarily rotating the second planar element 14 of the substrate 11 about the hinge 42, thus eliminating the specific manufacturing process of breaking the substrate 11. Rotating the second planar element 14 of the substrate 11 allows the transmission axis 32 and 34 of the optical array 18 to be aligned parallel to the first planar element 12 of the substrate 11, further promoting planarity and thus manufacturability.

Figure 6:
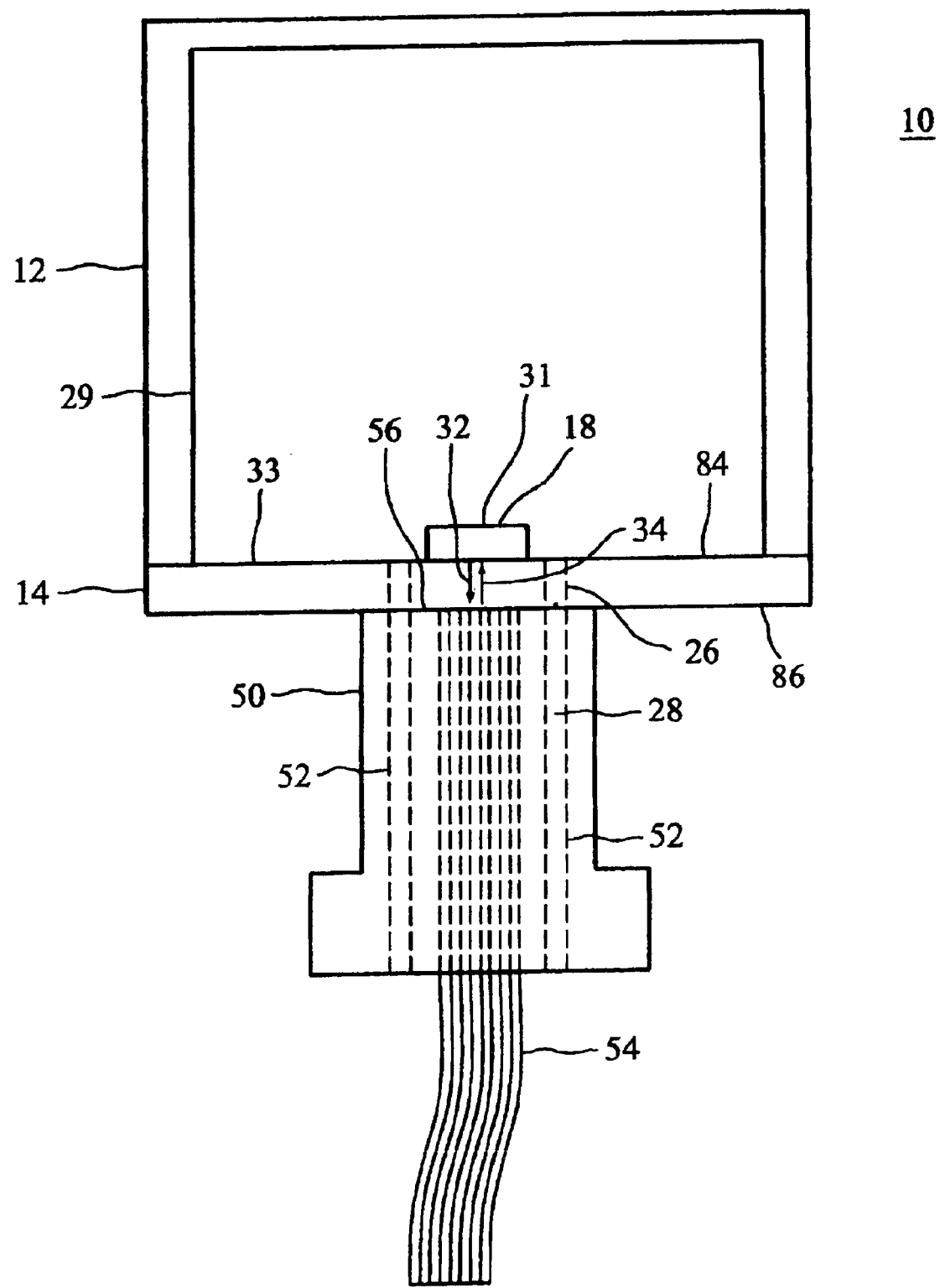
FIG. 6 illustrates a top view of an electro-optic communication system.

FIG. 6 is a top view illustrating the mating of the second surface 86 of the second planar element 14 of the substrate 11 with the first surface 56 of the optical fiber holder 50. The alignment pins 28 may be inserted through the alignment apertures 52 of the fiber holder 50. As shown in FIGS. 1 and 6, the alignment pin holder 29 may restrict rotation 88 of the second planar element 14 about the hinge 42. The pin holder 29 and the first surface 84 of the second planar element 14 may then be mechanically attached by an adhesive 62 or similar material, once the desired angle of rotation 88 is achieved. The alignment pin holder 29 may also contain a removed section 31 located proximate the optical array 18. The removed section 31 may prevent the pin holder 29 from coming in contact with and hence exerting a force on the optical array 18 and possibly causing damage. Thus, the section 33 of the pin holder 29 without a removed section 31 may then come in contact with the first surface 84 of the second planar element 14 of the substrate 11. The first surface 56 of the optical fiber holder 50 may be coincident with the second surface 86 of the second planar element 14 of the substrate 11, as shown in FIG. 6. Optical signals 32 and 34 passing directly through the second planar element 14 of the substrate 11 would form an optical interface of light transmission.

ALTERNATIVE EMBODIMENTS OF THE INVENTION

As previously stated, the substrate's break region or hinge 42 could be located at any location along the length 74 of the substrate. In a preferred embodiment of the invention the groove 46 on the substrate 11 would be located between the optical array 18 and the electrical IC 16 on the second surface 86 of the substrate 11. In an additional embodiment of the invention shown in FIG. 7b, the groove 46 and corresponding hinge 42 could be located on the substrate 11 between a second edge 82 and the electrical IC 16.

In another embodiment of the invention, the bending of the substrate 11 could be performed by using a heated wire bending process, thus eliminating the laser ablation process. The substrate 11 could be placed in a mechanical fixture that would heat a portion of the substrate 11 using a thin, hot wire. The temperature of the substrate 11 would rise appropriately to facilitate the bending of the substrate 11. The substrate 11 would not have a break region, but would have a hinge 42 as stated before.

Figure 8A:
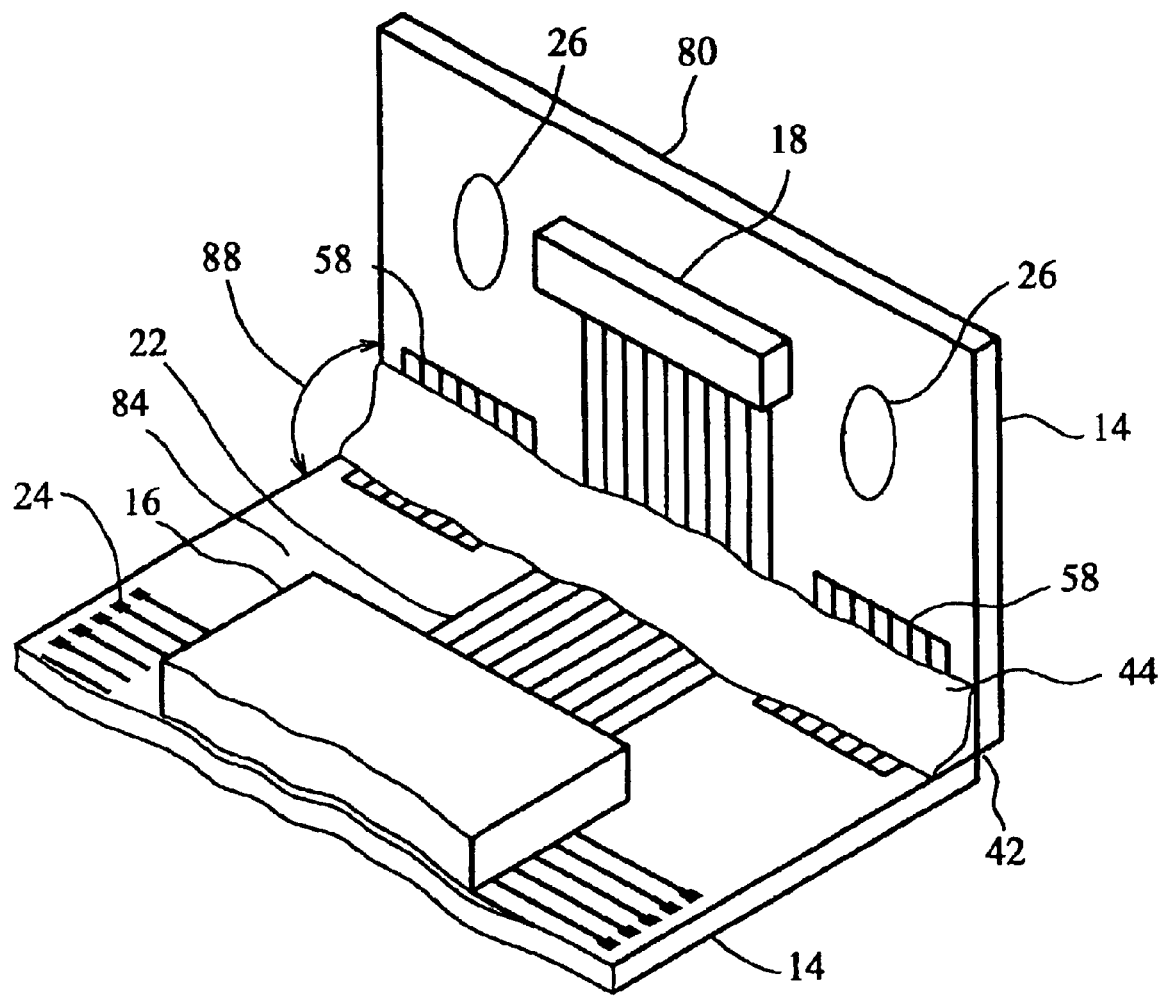
FIG. 8a is a broken perspective view of a structural material creating a flexible interconnect region, in an alternate embodiment of the invention.
Figure 8B:
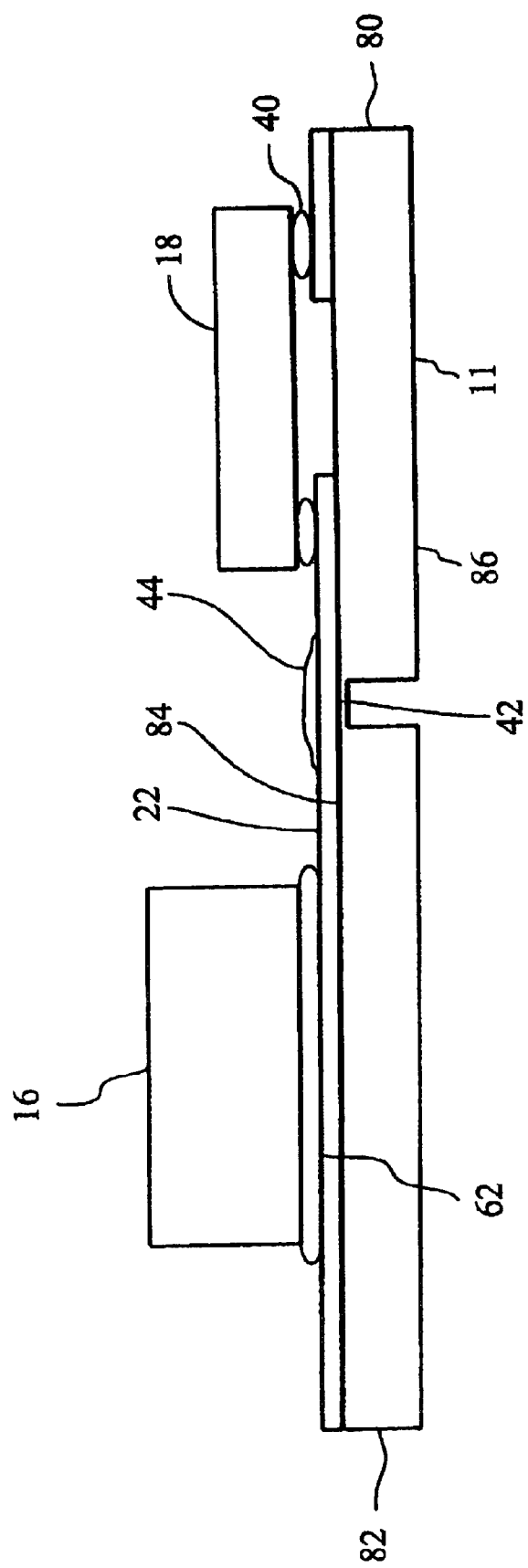
FIG. 8b is a side view of a structural material creating a flexible interconnect region, in an alternate embodiment of the invention.

FIG. 8a and FIG. 8b show a thin, structural material 44 that could be disposed on the hinge 42 of the substrate 11, on the first surface 84, in an alternate embodiment of the invention. This material could be placed on the hinge whether a heated wire or laser ablation process is used to bend the substrate 11. The material could comprise a flexible insulative material such as a polyimide. Common trade names for polyimide are "KAPTON" and "UPLEX." The material 44 could form a layer over the electrical traces 22, 58 on the hinge 42.

Additional traces 58 could be placed on the substrate as shown in FIGS. 4, 7a, 7b, and 8a. The traces could be formed using conventional photolithography etching techniques, or a similar process. The traces could provide mechanical strength in supporting the second planar element 14 of the substrate 14 in the desired angular position 88.

An additional mechanical strength (not shown) layer could be deposited over the metal traces, bonding to both the first layer of polyimide 44 and the traces 22 and 58, thus creating a flex interconnect region. Additional metal traces (not shown) could traverse over this flex region to provide additional mechanical interconnection or to provide a ground plane. The flexible, structural material 44 could be applied before the substrate 11 is broken and rotated by a liquid deposition process. The thin layer 44 could be formed by using a spinning and screen-printing process.

While a specific embodiment of the invention has been shown and described, further modifications and improvements will occur to those skilled in the art. This invention, therefore, is not limited to the particular forms shown, and the appended claims cover all modifications that do not depart from the spirit and scope of this invention.

What is claimed is:

1. A method of coupling an optical signal between an optical array and a flexible optical waveguide, such method comprising the steps of:

disposing the optical array on an optically transparent substrate with an axis of transmission of an optically active element of the optical array passing directly through a body of the substrate;

aligning a set of guide pins to the optically active element of the optical array;

securing the aligned guide pins to the substrate; and detachably coupling the flexible optical waveguide to the guide pins so that the axis of transmission of the optically active element is aligned with an axis of transmission of the flexible optical waveguide.

2. The method of coupling the optical signal as in claim 1 further comprising locating the optical array disposed on the substrate proximate a first end of the substrate and disposing a signal processor proximate a second end of the substrate.

3. The method of coupling the optical signal as in claim 2 further comprising dividing the optically transparent substrate along a dividing line into a first planar surface supporting the optical array and a second planar surface supporting the signal processor.

4. The method of coupling the optical signal as in claim 3 wherein the step of dividing further comprising disposing a set of electrical traces across the dividing line so that the set of traces electrically couple the array with the signal processor.

5. The method of coupling the optical signal as in claim 4 further comprising rotating the first planar surface relative to the second planar surface along the dividing line.

6. The method of coupling the optical signal as in claim 5 wherein the step of rotating further comprises rotating the first planar surface relative to the second planar surface along the dividing line until the relative angle substantially equals ninety degrees.

7. The method of coupling the optical signal as in claim 6 wherein the step of rotating further comprising heating the substrate along the dividing line.

8. The method of coupling the optical signal as in claim 7 wherein the step of dividing the optically transparent substrate further comprises fracturing the substrate along the dividing line.

9. The method of coupling the optical signal as in claim 8 wherein the step of rotating further comprising ablating the substrate along the dividing line.

10. The method of coupling the optical signal as in claim 8 wherein the step of fracturing further comprising joining the first and second planar surfaces with a flexible hinge.

11. The method of coupling the optical signal as in claim 10 wherein the step of joining the first and second planar surfaces with a flexible hinge further comprises disposing a layer of polyimide across the dividing line.

12. The method of coupling the optical signal as in claim 1 wherein the step of securing the set of guide pins to the substrate further comprises disposing a pin holder adjacent the optical array so that the guide pins are supported on a first side of the substrate by the pin holder and extend through the substrate to engage the flexible optical waveguide on a second side of the substrate.

13. An apparatus for coupling an optical signal between an optical array and a flexible optical waveguide, such apparatus comprising:

the optical array disposed on an optically transparent substrate with an axis of transmission of an optically active element of the optical array passing directly through a body of the substrate;

means for aligning a set of guide pins to the optically active element of the optical array;

means for securing the aligned guide pins to the substrate; and means for detachably coupling the flexible optical waveguide to the guide pins so that the axis of transmission of the optically active element is aligned with an axis of transmission of the flexible optical waveguide.

14. The apparatus for coupling the optical signal as in claim 13 further comprising the optical array disposed on the substrate proximate a first end of the substrate and a signal processor disposed proximate a second end of the substrate.

15. The apparatus for coupling the optical signal as in claim 14 wherein the optically transparent substrate further comprises a first planar surface supporting the optical array and a second planar surface supporting the signal processor.

16. The apparatus for coupling the optical signal as in claim 15 further comprising a set of electrical traces disposed across a dividing line between the first and second planar surfaces so that the set of traces electrically couple the array with the signal processor.

17. The apparatus for coupling the optical signal as in claim 16 further comprising the first planar surface being disposed at a predetermined angle with respect to the second planar surface along the dividing line.

18. The apparatus for coupling the optical signal as in claim 17 wherein the predetermined angle between the first and second planar surfaces further comprises ninety degrees.

19. The apparatus for coupling the optical signal as in claim 18 further comprising means for flexibly joining the first and second planar surfaces.

20. The apparatus for coupling the optical signal as in claim 19 wherein the means for flexibly joining the first and second planar surfaces further comprises a layer of polyimide disposed across the dividing line.

21. The apparatus for coupling the optical signal as in claim 13 further comprising a pin holder disposed on a first side of the substrate with the guide pins extending through the substrate to engage the pin holder on a first side of the substrate and the waveguide on a second side of the substrate.

22. An apparatus for coupling an optical signal between an optical array and a flexible optical waveguide, such apparatus comprising:

an optically transparent substrate;

the optical array disposed on the optically transparent substrate with an axis of transmission of an optically active element of the optical array passing directly through a body of the substrate;

a set of guide pins aligned with the optically active element of the optical array; and a set of apertures adapted to secure the aligned guide pins to the substrate.

23. The apparatus for coupling the optical signal as in claim 22 further comprising the optical array disposed on the substrate proximate a first end of the substrate and a signal processor disposed proximate a second end of the substrate.

24. The apparatus for coupling the optical signal as in claim 23 wherein the optically transparent substrate further comprises a first planar surface supporting the optical array and a second planar surface supporting the signal processor.

25. The apparatus for coupling the optical signal as in claim 24 further comprising a set of electrical traces dis posed across a dividing line between the first and second planar surfaces so that the set of traces electrically couple the array with the signal processor.

26. The apparatus for coupling the optical signal as in claim 25 further comprising the first planar surface being disposed at a predetermined angle with respect to the second planar surface along the dividing line.

27. The apparatus for coupling the optical signal as in claim 26 wherein the predetermined angle between the first and second planar surfaces further comprises ninety degrees.

28. The apparatus for coupling the optical signal as in claim 27 further comprising a flexible hinge joining the first and second planar surfaces.

29. The apparatus for coupling the optical signal as in claim 28 wherein the flexible hinge further comprises a layer of polyimide disposed across the dividing line.

30. The apparatus for coupling the optical signal as in claim 22 further comprising a pin holder disposed adjacent the substrate with the guide pins extending through the set of apertures within the substrate to engage the pin holder.

31. The apparatus for coupling the optical signal as in claim 22 wherein the optical array further comprises a plurality of one of optical transmitters and optical receivers.

* * * * *